US007858989B2

(12) United States Patent
Chen et al.

(10) Patent No.: US 7,858,989 B2
(45) Date of Patent: Dec. 28, 2010

(54) DEVICE AND PROCESS OF FORMING DEVICE WITH DEVICE STRUCTURE FORMED IN TRENCH AND GRAPHENE LAYER FORMED THEREOVER

(75) Inventors: An Chen, Sunnyvale, CA (US); Zoran Krivokapic, Santa Clara, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 298 days.

(21) Appl. No.: 12/201,801

(22) Filed: Aug. 29, 2008

(65) Prior Publication Data

US 2010/0051897 A1    Mar. 4, 2010

(51) Int. Cl.
*H01L 29/15* (2006.01)
(52) U.S. Cl. .......... 257/76; 257/E29.082; 257/E21.051; 438/105
(58) Field of Classification Search .................. 257/76, 257/E29.082, E21.051; 438/105
See application file for complete search history.

(56) References Cited

U.S. PATENT DOCUMENTS 7,732,859 B2 *   6/2010   Anderson et al. ........... 257/328

2009/0169919 A1 *  7/2009   Garcia et al. ................. 428/688

OTHER PUBLICATIONS

Claire Berger, Zhimin Song, Tianbo Li, Xuebin Li, Asmerom Y. Ogbazghi, Rui Feng, Zhenting Dai, Alexei N. Marchenkov, Edward H. Conrad, Phillip N. First, and Walt A. De Heer; "Ultrathin Epitaxial Graphite: 2D Electron Gas Properties and a Route toward Graphene-based Nanoelectronics"; *J. Phys. Chem. B* 2004, 108, pp. 19912-19916.

K. S. Novoselov et al.; "Electric Field Effect in Atomically Thin Carbon Films"; Science 306. pp. 666-609 (2004); DOI: 10.1126/science.1102896; Oct. 22, 2004 vol. 306 Science.

Scott Gilje, Song Han, Minsheng Wang, Kang L. Wang, and Richard B. Kaner; "A Chemical Route to Graphene for Device Applications"; Nano Letters, 2007, vol. 7 No. 11, pp. 3394-3398.

* cited by examiner

*Primary Examiner*—Trung Dang
(74) *Attorney, Agent, or Firm*—Ditthavong, Mori & Steiner, P.C.

(57) ABSTRACT

A graphene-based device is formed with a substrate having a trench therein, a device structure on the substrate and within the trench, a graphene layer over the device structure, and a protective layer over the graphene layer. Fabrication techniques include forming a trench in a substrate, forming a device structure within the trench, forming a graphene layer over the device structure, and forming a protective layer over the graphene layer.

22 Claims, 6 Drawing Sheets

DEVICE AND PROCESS OF FORMING DEVICE WITH DEVICE STRUCTURE FORMED IN TRENCH AND GRAPHENE LAYER FORMED THEREOVER

BACKGROUND OF THE INVENTION

1. Field of the Invention

The present invention relates to the formation of graphene-based devices.

2. Discussion of the Background

Graphene is a flat monolayer of carbon atoms tightly packed into a two-dimensional honeycomb lattice that resembles chicken wire. It is the building block for graphite material. Graphene has attracted great attention for electronic applications due to its extremely high mobility (e.g., over 200,000 $cm^2/V \cdot s$) and some unique properties (e.g., bandgap modulation by structure). However, the fabrication methods for graphene devices are still quite rudimentary. Current methods lack good control of device dimensions and structures.

Graphene has some unique material properties that make it very attractive for electronic applications. Its mobility has been demonstrated to be over 200,000 $cm^2/V \cdot s$ in experiments. Unlike the high mobility in some un-doped bulk semiconductors, graphene mobility remains high even at high carrier concentration. Carrier transport in graphene can be ballistic on the micrometer scale at room temperature. Similar to carbon nanotubes, graphene has ambipolar electric field effect, i.e., it can be electrically doped to become n-type or p-type depending on the gate voltage. The badgap of semiconducting graphene can be modulated by its structure, e.g., the width of a graphene stripe. Graphene also has superior thermal conductivity that can enable some on-chip thermal management functions. As a natural two-dimensional system with planar form, graphene is easier to pattern than carbon nanotubes. Also, graphene can be potentially made with very low cost.

The first few-layer graphene was prepared by mechanical exfoliation of highly-oriented graphite. (See, e.g., K. S. Novoselov, et al, "Electric Field Effect in Atomically Thin Carbon Films", Science 306, 666 (2004).) Even a graphene monolayer can be prepared with this method; however, such a method is unsuitable for production. Another method of growing graphene is the thermal decomposition of SiC where Si atoms are removed and C atoms left behind form graphene-like structures in the surface layers. (See, e.g., C. Berger, et al., "Ultrathin Epitaxial Graphite: 2D Electron Gas Properties and a Route toward Graphene-based Nanoelectronics", J. Phys. Chem. B 108, 19912 (2004).) A drawback of this method is the high temperature (~1400° C.) in this process. More methods are being developed including chemical synthesis. (See, e.g., S. Gilje, et al., "A Chemical Route to Graphene for Device Applications", Nano Lett. 7, 3394 (2007).) It is expected that some low-temperature material preparation methods suitable for production will be developed for graphene.

FIG. 5 depicts a graphene-based field effect transistor (FET) structure, which is fabricated and structured according to a related art process. Such a related art process for fabricating graphene devices includes providing a substrate 110 and then first growing or depositing a graphene layer on the substrate 110. Then, the process includes patterning the device structures by etching the graphene layer to form graphene 112, and depositing source and drain regions 114, a gate dielectric 116 and a gate metal 118. The variety and complexity of device structures and dimensions are limited by the difficulty of handling the graphene layer. The processing temperature is limited by the stability of the graphene layer.

Thus, a need exists for a process for forming graphene-based devices that provides improved control of device dimensions and structures.

SUMMARY OF THE INVENTION

The present invention advantageously provides embodiments of a process that includes forming a trench in a substrate, forming a device structure within the trench, forming a graphene layer over the device structure, and forming a protective layer over the graphene layer.

The present invention further advantageously provides embodiments of a graphene-based device that includes a substrate having a trench formed therein, a device structure formed on the substrate and within the trench, a graphene layer formed over the device structure, and a protective layer formed over the graphene layer.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF EMBODIMENTS OF THE INVENTION

Figure 1A:
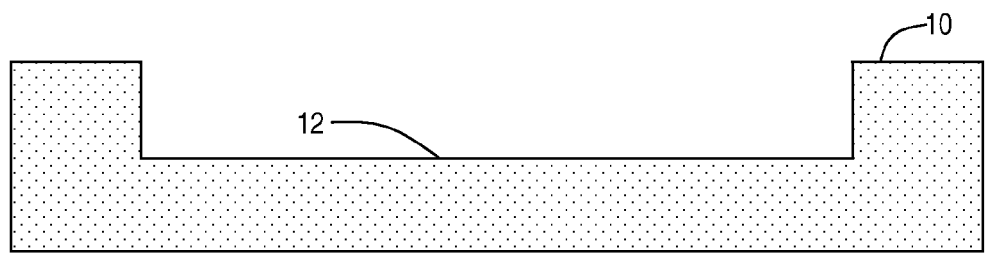
FIGS. 1A-1E depict a process of formation of a graphene-based field effect transistor (FET) structure, which is fabricated and structured according to an embodiment of the present invention.

Embodiments of the present invention will be described hereinafter with reference to the accompanying drawings. In the following description, the constituent elements having substantially the same function and arrangement are denoted by the same reference numerals, and repetitive descriptions will be made only when necessary.

Embodiments of the present invention utilize pre-patterned device structures and electrodes before the deposition/growth of the graphene layer. Such a process simplifies the fabrication process and enables a large variety of device dimensions and structures for graphene devices. By pre-patterning the device structures, the device structures can be made small, and then the graphene layer can be added over the pre-patterned device structures, which can help to avoid damaging the graphene. Also, only a cap layer is then used to protect the graphene.

The processes disclosed herein can be used on a variety of device structures, for example, n-type or p-type field effect transistors, bipolar devices, p-n junctions, etc. The processes disclosed herein can be used to form various types of electrical devices or other devices, and the devices can include materials that may or may not be considered semiconductor materials.

FIGS. 1A-1E depict a process of formation of a graphene-based field effect transistor (FET) structure, which is fabricated and structured according to an embodiment of the present invention.

In the process step shown in FIG. 1A, a trench 12 is etched in an insulating substrate material 10 (e.g., $SiO_2$). The depth of the trench can be sized based upon the device structures being formed within the trench. For example, while currently depths on the order of 200 to 400 microns can be sufficient, in the future depths as shallow as 50 to 100 nanometers may be possible and more desirable.

Figure 1B:
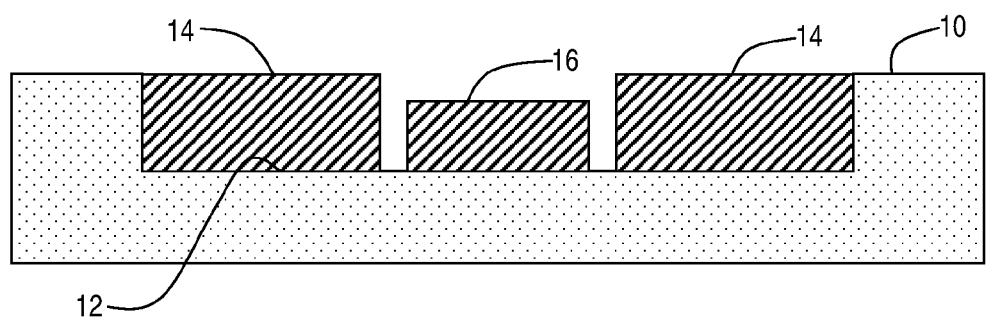

In the process step shown in FIG. 1B, metal contacts 14 for source and drains regions are deposited and patterned on the substrate 10 within the trench 12. Additionally, a metal contact 16 for a gate is deposited and patterned on the substrate 10 within the trench 12. Thus, source/drain metal contacts and a gate metal contact are formed on the substrate 10 within the trench 12.

Figure 1C:
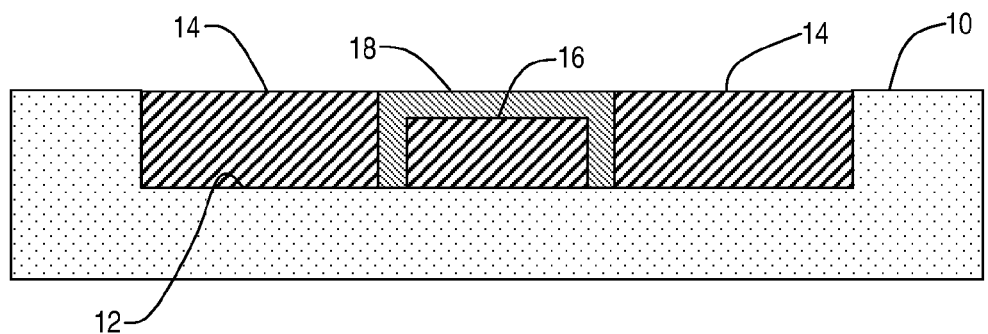

In the process step shown in FIG. 1C, a gate dielectric 18 (e.g., a high-k insulator) is deposited about the gate metal contact 16, and a chemical mechanical polish (CMP) is performed to polish the upper surface of the device structure to arrive at the device structure shown in FIG. 1C.

Figure 1D:
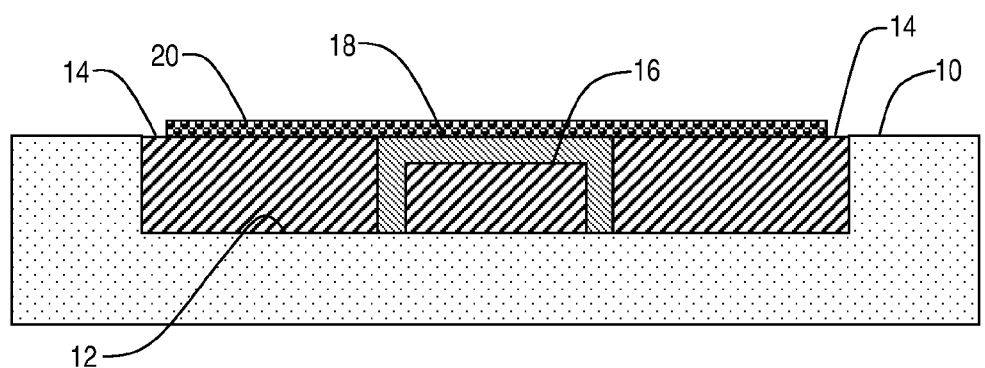

In the process step shown in FIG. 1D, a graphene layer 20 is provided upon the upper surface of the device structure. The graphene layer 20 can be grown, deposited, or transferred onto the upper surface of the device structure, and then the graphene layer can be processed by alignment and patterning using the trench 12 as the reference.

Figure 1E:
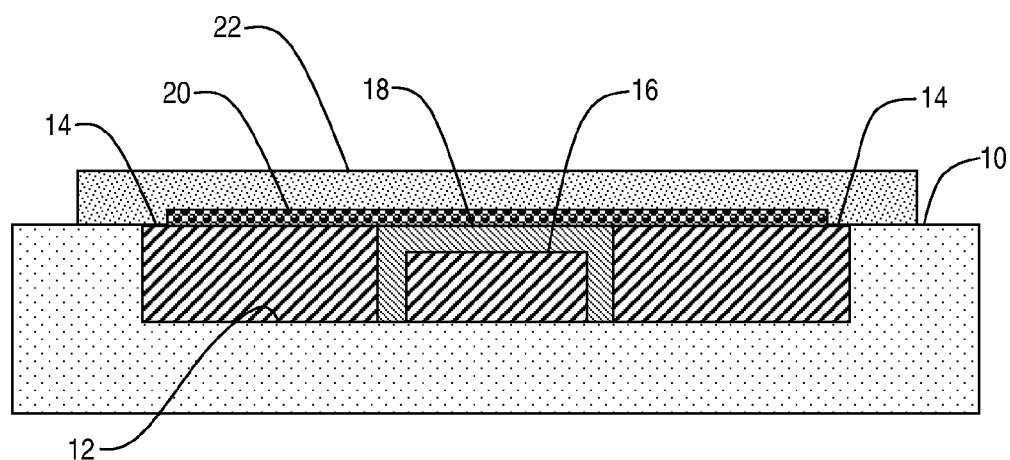

In the process step shown in FIG. 1E, a protective insulator cap 22 is deposited to cover the entire device structure. Typically, any quality of insulator can be used to form the protective insulator cap, and therefore an inexpensive insulator is preferably used.

In the graphene-based field effect transistor shown in FIG. 1E, it is not necessary to add dopant to the graphene layer. It is possible to use one trench per device structure, and/or more than one device structure per trench where the plural device structures within each trench are isolated/separated by dielectric material. Also, in a plural device configuration, where the devices are provided in either a common trench or in separate trenches, the graphene layer can be initially formed over plural devices and then patterned for each device to form graphene layers for each device, and/or graphene layers can be initially formed over individual devices with the graphene layers being in isolation from one another.

FIGS. 2A-2F depict a process of formation of a graphene-based field effect transistor (FET) structure, which is fabricated and structured according to another embodiment. In this embodiment, the pre-patterning process of the structures within the trench are altered. More specifically, in this embodiment the source/drain contact metals are deposited after the formation of the gate metal contact and gate dielectrics.

Figure 2A:
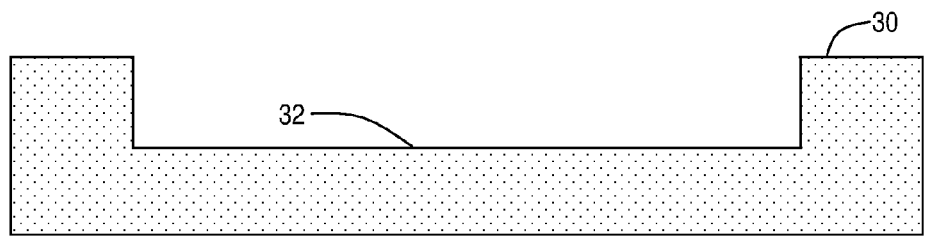
FIGS. 2A-2F depict a process of formation of a graphene-based field effect transistor (FET) structure, which is fabricated and structured according to another embodiment of the present invention.

In the process step shown in FIG. 2A, a trench 32 is etched in an insulating substrate material 30 (e.g., $SiO_2$). The depth of the trench can be sized based upon the device structures being formed within the trench.

Figure 2B:
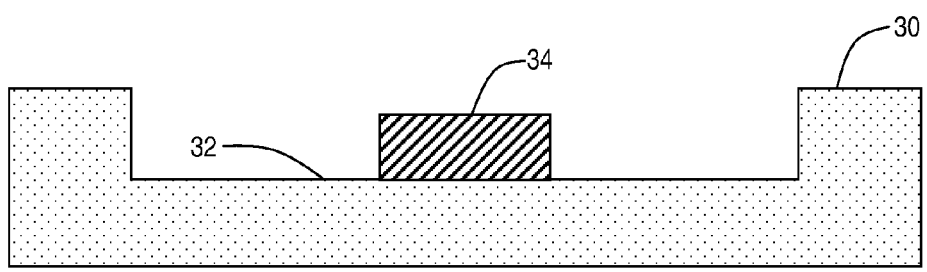

In the process step shown in FIG. 2B, a metal contacts 34 for a gate is deposited and patterned on the substrate 30 within the trench 32.

Figure 2C:
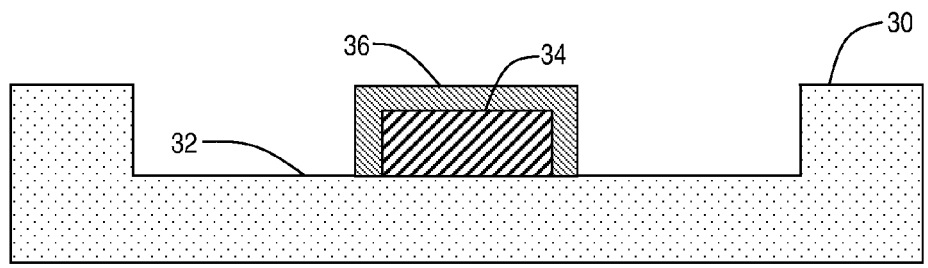

In the process step shown in FIG. 2C, a gate dielectric material (e.g., a high-k insulator) is deposited about the gate metal contact 34, and processes such as a patterning/etching process performed to form the gate dielectric 36 about the gate metal contact 34.

Figure 2D:
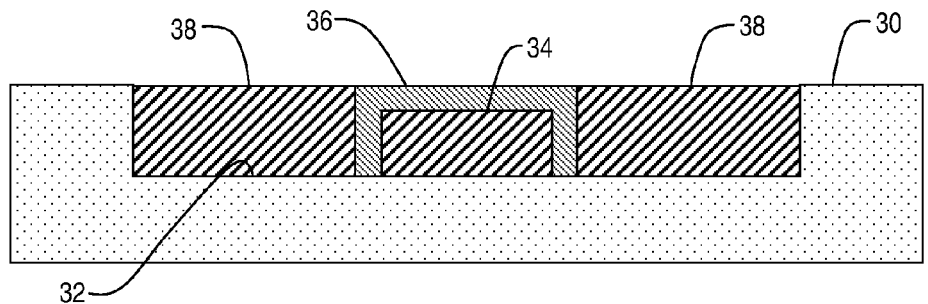

In the process step shown in FIG. 2D, metal contacts 38 for source and drains regions are deposited on the substrate 30 within the trench 32 to form the device structure shown in FIG. 2D. A CMP is performed to polish the upper surface of the device structure, to prepare a flat surface for the graphene layer.

Figure 2E:
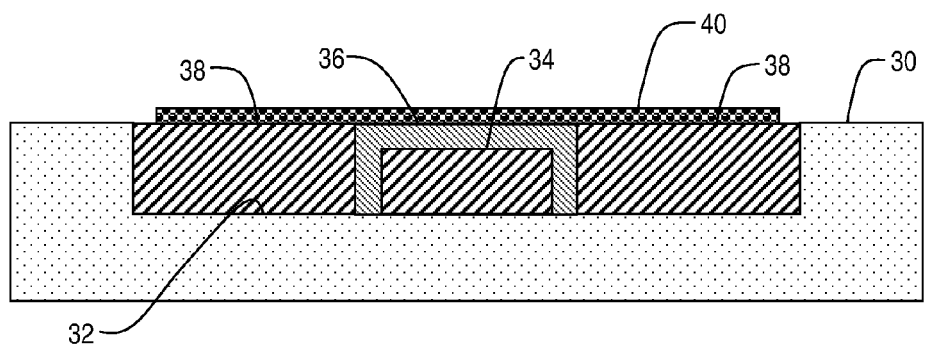

In the process step shown in FIG. 2E, a graphene layer 40 is provided upon the upper surface of the device structure. The graphene layer 40 can be grown, deposited, or transferred onto the upper surface of the device structure, and then the graphene layer can be processed by alignment and patterning using the trench 32 as the reference. The graphene layer can be prepared by several methods, e.g., transfer of a graphene layer prepared by mechanical exfoliation method or chemical synthesis.

Figure 2F:
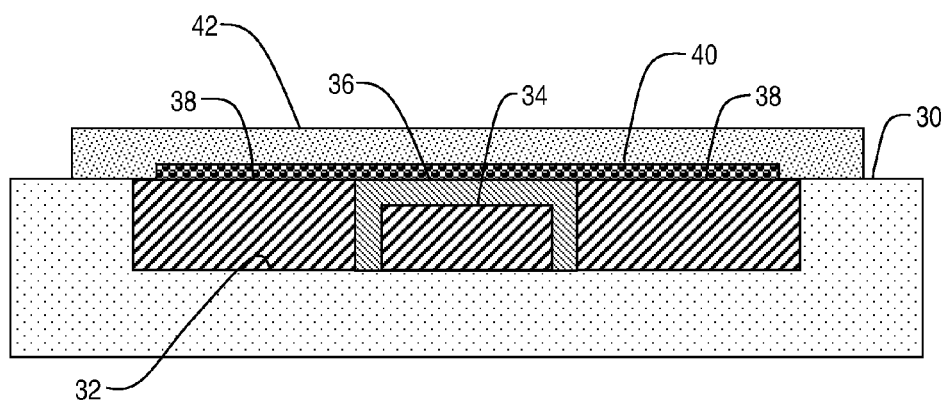

In the process step shown in FIG. 2F, a protective insulator cap 42 is deposited to cover the entire device structure.

Figure 3A:
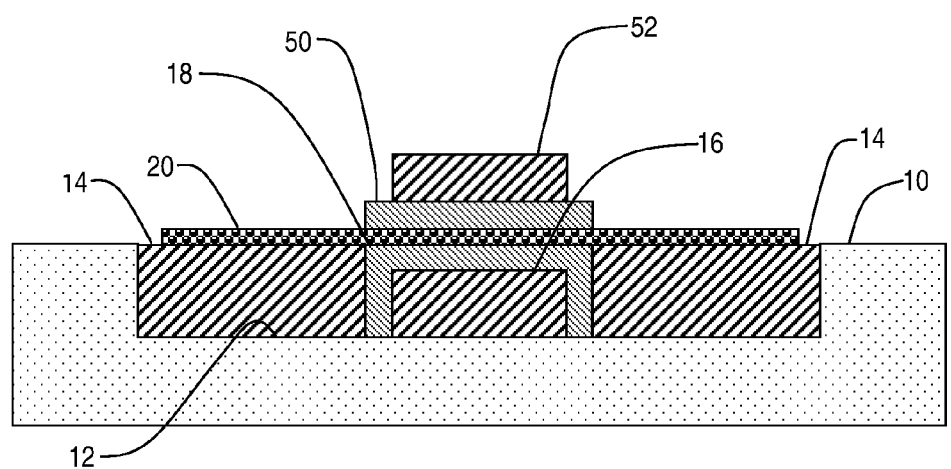
FIGS. 3A and 3B depict a process of formation of a double-gate graphene-based field effect transistor (FET) structure, which is fabricated and structured according to another embodiment of the present invention.
Figure 3B:
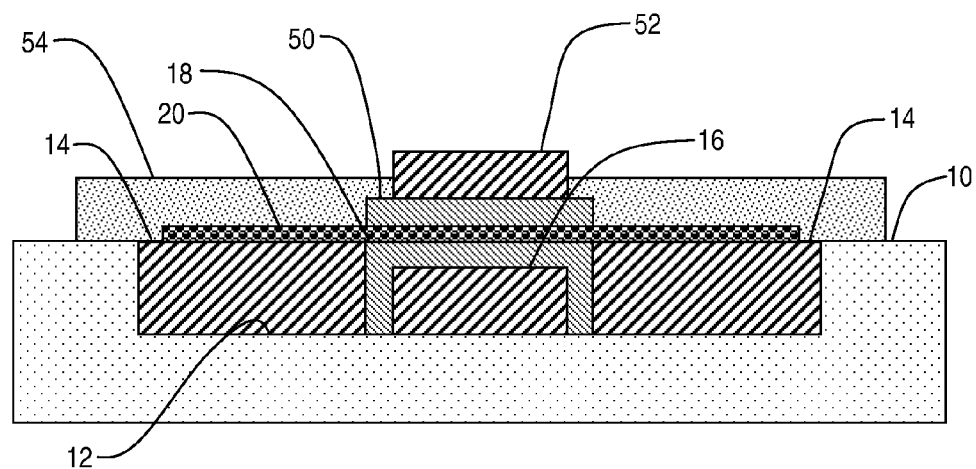

FIGS. 3A and 3B depict a process of formation of a double-gate graphene-based field effect transistor (FET) structure, which is fabricated and structured according to another embodiment of the present invention. FIGS. 3A and 3B build upon the structure shown in FIG. 1D to form a top gate structure upon the lower device structure, which includes the metal contacts 14 for source and drains regions, the metal gate contact 16, the gate dielectric 18, and the graphene layer 20.

In FIG. 3A, a top gate dielectric material 50 is formed on an upper surface of the graphene layer 20, and a top gate metal 52 is formed on an upper surface of the top gate dielectric material 50. In the process step shown in FIG. 3B, a protective insulator cap 54 is deposited over the double gate graphene FET structure. By using the pre-patterned trench method to build the lower graphene device structure, another gate structure can be built on top of graphene layer 20, to form a double-gate structure on graphene.

Thus, the process of pre-patterning a graphene device structure in a trench is combined with a process of top-gate structure, to create a double-gate structure for graphene devices. The two gates can be connected to function essentially as one gate-control from both sides of graphene. Or, in an alternative configuration, the two gates can be vertically misaligned to control different areas of the graphene channel, which can be used as an electrically-doped p-n junction with the two gates connected to opposite voltages. For example, the two gates can electrically dope graphene to n-type and p-type to create a p-n junction in graphene channel.

In yet another variation, a further set of source and drain metal contacts can be made on top of graphene as well.

Other double-gate graphene devices simply use a thick-layer of insulator on which graphene was made as a backside gate dielectrics, which provides little control on the structure and dimension of the backside gate. The processes disclosed herein provide a pre-patterned device structure underneath a graphene layer, and thus can be utilized to make a double-gate graphene device with better process control.

Figure 4:
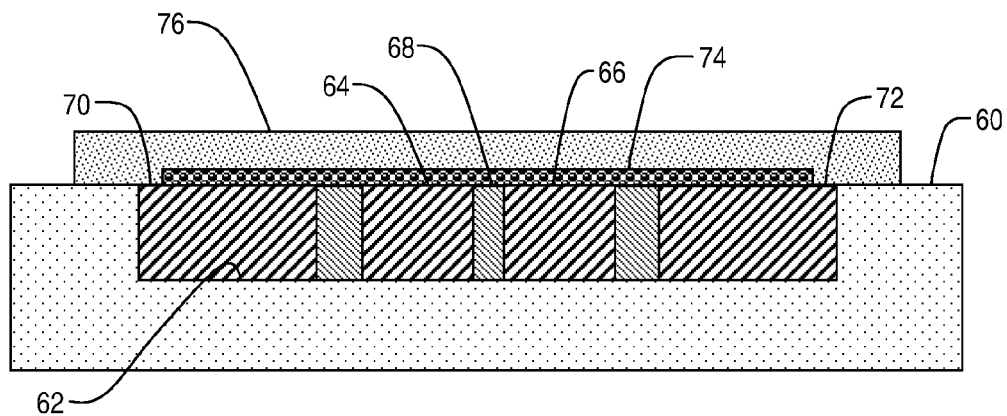
FIG. 4 depicts a graphene-based P-N junction, which is fabricated and structured according to a further embodiment of the present invention.
Figure 5:
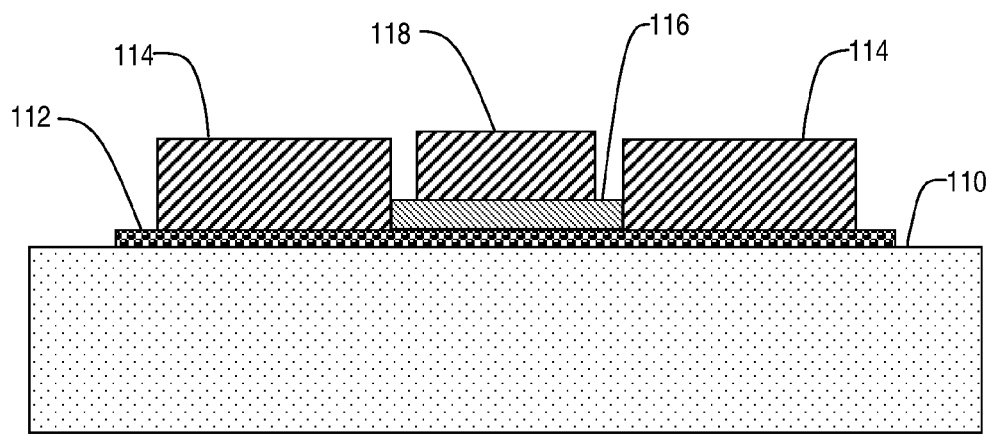
FIG. 5 depicts a graphene-based field effect transistor (FET) structure, which is fabricated and structured according to a related art process.

As noted above, the processes disclosed herein can be used on a variety of device structures. FIG. 4 depicts a graphene-based P-N junction, which is fabricated and structured according to a further embodiment.

As can be seen in the structure depicted in FIG. 4, a trench 62 is etched in an insulating substrate material 60 (e.g., $SiO_2$). Gates 64 and 66 and metal contacts 70 and 72, with dielectrics 68 therebetween, are all pre-patterned in the trench 62 before the fabrication of the graphene layer 74. And, a protective insulator cap 76 is deposited to cover the entire device structure.

In operation, opposite voltages are applied to the gates 64 and 66 in FIG. 4 to introduce n-type and p-type conduction regions in the graphene layer 74 from an ambipolar field effect. In other words, the graphene is electrically doped to n-type and p-type by the two gate voltages, and conduction between the two end contacts 70 and 72 will pass through the graphene-based P-N junction.

The processes for fabricating graphene devices disclosed herein are advantageous in that the processes are simpler than other processes of forming graphene devices, since in the processes disclosed herein the device structures are already defined prior to the preparation of the graphene layer. Additionally, the processes disclosed herein provide more control over device dimensions and structures, because more complicated device design and fabrication can be implemented without worrying about the presence of a graphene layer when the device structures are formed. The processes disclosed herein also improve circuit reliability, because the contacts and interconnects can be implemented and tested during the pre-patterning process. This pre-patterning process can be used to fabricate not only individual graphene devices but also large-scale circuits. Furthermore, the processes disclosed herein create buried contacts and can enable stackable integrated circuits using graphene.

It should be noted that the exemplary embodiments depicted and described herein set forth the preferred embodiments of the present invention, and are not meant to limit the scope of the claims hereto in any way. Numerous modifications and variations of the present invention are possible in light of the above teachings. It is therefore to be understood that, within the scope of the appended claims, the invention may be practiced otherwise than as specifically described herein.

What is claimed is:

1. A process comprising:
    forming a trench in a substrate;
    forming a device structure within the trench;
    forming a graphene layer over the device structure; and
    forming a protective layer over the graphene layer.

2. The process according to claim 1, comprising forming the graphene layer by deposition.

3. The process according to claim 1, comprising forming the graphene layer by growing the graphene layer on the device structure.

4. The process according to claim 1, comprising forming the graphene layer by transferring a pre-formed layer of graphene onto the device structure.

5. The process according to claim 4, comprising forming the pre-formed layer of graphene by mechanical exfoliation or chemical synthesis.

6. The process according to claim 1, comprising forming the graphene layer by forming a layer of graphene material over the device structure, and aligning and patterning the layer of graphene material with the trench as a reference to form the graphene layer.

7. The process according to claim 1, comprising forming the device structure within the trench by depositing material and patterning metal contacts for source/drain regions and a gate in the trench, providing a dielectric between the metal contacts for the source/drain regions and the gate, and providing the dielectric between the gate and the graphene layer formed over the device structure.

8. The process according to claim 1, wherein the device structure is a field effect transistor.

9. The process according to claim 1, comprising forming the device structure within the trench by depositing material and patterning metal contacts for source/drain regions and two adjacent gates in the trench, wherein the graphene layer formed over the device structure is electrically doped.

10. The process according to claim 1, wherein the device structure is a p-n junction.

11. The process according to claim 1, wherein the protective layer is formed over the entire graphene layer.

12. The process according to claim 11, wherein the entire device structure is covered by the graphene layer and the protective layer.

13. The process according to claim 1, further comprising:
    forming an additional device structure over the graphene layer,
    wherein the protective layer is formed over the graphene layer and the additional device structure.

14. A graphene-based device comprising:
    a substrate having a trench formed therein;
    a device structure formed on said substrate and within said trench;
    a graphene layer formed over said device structure; and
    a protective layer formed over said graphene layer.

15. The device according to claim 14, wherein said device structure includes metal contacts for source/drain regions and a gate formed on said substrate in said trench, wherein said device structure further includes a dielectric provided between said metal contacts for said source/drain regions and said gate, and wherein said dielectric is provided between said gate and said graphene layer.

16. The device according to claim 14, wherein said device structure is a field effect transistor.

17. The device according to claim 14, wherein said device structure includes metal contacts for source/drain regions and two adjacent gates in said trench, and wherein said graphene layer formed over said device structure is electrically doped.

18. The device according to claim 14, wherein said device structure is a p-n junction.

19. The device according to claim 14, wherein said protective layer is formed over the entire graphene layer.

20. The device according to claim 19, wherein the entire device structure is covered by said graphene layer and said protective layer.

21. The device according to claim 14, wherein said graphene layer is aligned and patterned with said trench as a reference.

22. The device according to claim 1, further comprising:
    an additional device structure formed over said graphene layer,
    wherein said protective layer is formed over said graphene layer and said additional device structure.

* * * * *